US010084445B2

(12) United States Patent
de Rooij et al.

(10) Patent No.: US 10,084,445 B2
(45) Date of Patent: Sep. 25, 2018

(54) HIGH VOLTAGE ZERO QRR BOOTSTRAP SUPPLY

(71) Applicant: Efficient Power Conversion Corporation, El Segundo, CA (US)

(72) Inventors: Michael A. de Rooij, Playa Vista, CA (US); Johan T. Strydom, San Jose, CA (US); David C. Reusch, Blacksburg, VA (US)

(73) Assignee: Efficient Power Conversion Corporation, El Segundo, CA (US)

( * ) Notice: Subject to any disclaimer, the term of this patent is extended or adjusted under 35 U.S.C. 154(b) by 0 days.

(21) Appl. No.: 15/497,637

(22) Filed: Apr. 26, 2017

(65) Prior Publication Data
US 2017/0230046 A1 Aug. 10, 2017

Related U.S. Application Data

(62) Division of application No. 14/877,613, filed on Oct. 7, 2015, now Pat. No. 9,667,245.

(60) Provisional application No. 62/062,445, filed on Oct. 10, 2014.

(51) Int. Cl.
*H03K 3/00* (2006.01)
*H03K 17/567* (2006.01)
*H03K 19/0175* (2006.01)

(52) U.S. Cl.
CPC ... *H03K 17/567* (2013.01); *H03K 19/017509* (2013.01); *H03K 2217/0063* (2013.01); *H03K 2217/0072* (2013.01)

(58) Field of Classification Search
CPC .................................................. H03K 17/567
See application file for complete search history.

(56) References Cited

U.S. PATENT DOCUMENTS

| 8,063,616 | B2 | 11/2011 | Bahramian et al. |
| 8,390,560 | B2 | 3/2013 | Toyoshima et al. |
| 9,397,563 | B2 | 7/2016 | Kihara et al. |
| 2008/0290841 | A1 | 11/2008 | Chang et al. |
| 2011/0018613 | A1 | 1/2011 | Wang |
| 2013/0063123 | A1 | 3/2013 | Liang |
| 2013/0241621 | A1* | 9/2013 | Forghani-Zadeh ......... H03K 17/08122 327/315 |

(Continued)

FOREIGN PATENT DOCUMENTS

| CN | 103004071 A | 3/2013 |
| TW | 306093 B | 5/1997 |
| TW | 200818674 A | 4/2008 |

(Continued)

*Primary Examiner* — Daniel Puentes
(74) *Attorney, Agent, or Firm* — Blank Rome LLP

(57) ABSTRACT

An electrical circuit arranged in a half bridge topology. The electrical circuit includes a high side transistor; a low side transistor; a gate driver and level shifter electrically coupled to a gate of the high side transistor; a gate driver electrically coupled to a gate of the low side transistor; a capacitor electrically coupled in parallel with the gate driver and level shifter; a voltage source electrically coupled to an input of the gate driver and level shifter and an input of the gate driver; and, a bootstrap transistor electrically coupled between the voltage source and the capacitor. A GaN field-effect transistor is synchronously switched with a low side device of the half bridge circuit.

13 Claims, 4 Drawing Sheets

(56) References Cited

U.S. PATENT DOCUMENTS

2014/0167069 A1 6/2014 Vielemeyer et al.
2014/0169052 A1 6/2014 Bahramian

FOREIGN PATENT DOCUMENTS

| TW | I337799 B | 2/2011 |
| TW | 201125270 A | 7/2011 |
| WO | WO 2009/002541 A1 | 12/2008 |
| WO | WO 2013/114746 A1 | 8/2013 |

* cited by examiner

HIGH VOLTAGE ZERO QRR BOOTSTRAP SUPPLY

CROSS REFERENCE TO RELATED APPLICATIONS

This is a divisional of U.S. application Ser. No. 14/877,613 filed Oct. 7, 2015, which claims the benefit under 35 U.S.C. 119(e) to U.S. Provisional Application No. 62/062,445 filed Oct. 10, 2014, the entire disclosures of which are incorporated by reference in their entireties.

BACKGROUND OF THE INVENTION

FIG. 1 illustrates a conventional half bridge topology 10. As shown, the conventional topology 10 includes a pair of transistors 12 and 14 labeled Q1 and Q2. Such a topology may, for example, be implemented with enhancement mode field effect transistors (FETs). Typically, the transistors 12 and 14 are considered high side and low side switches. The source 16 of high side transistor 12 is coupled to the drain 18 of low side transistor 14 at the half bridge output. The drain 20 of high side transistor 12 is coupled to a high voltage source 22 ($V_{MAIN}$), and the source 24 of low side transistor 14 is coupled to ground 26. Furthermore, the gate 28 of high side transistor 12 is coupled to a gate driver and a level shifter 30 and the gate 32 of low side transistor 14 is coupled to a gate driver 34. Gate drivers 30/34 and level shifters 30 are well-known in the art and will not be described in detail herein. However, it should be understood that this configuration enables one transistor 12 or 14 (Q1 or Q2) to be switched on and the other transistor to be switched off and vice versa during operation.

As further shown in FIG. 1, a driving voltage source 36 ($V_{Drvr}$) is coupled to an input 40 of the high side gate driver and level shifter 30 as well as an input 38 of the low side gate driver 34. For this conventional design, a bootstrap capacitor 42 ($C_{BTST}$) is coupled in parallel with the high side gate driver and level shifter 30 and a bootstrap diode 44 ($D_{BTST}$) is coupled between the driving voltage source 36 $V_{Drvr}$ and the bootstrap capacitor 42 ($C_{BTST}$). When using eGaN FETs for the high side and low side transistors Q1 and Q2, the configuration shown in FIG. 1 yields approximately 7.5 V, for example, across the bootstrap capacitor 42 ($C_{BTST}$) if the "body diode" of low side transistor 14 (Q2) conducts. However, the voltage may vary depending on a number of factors. The voltage can be approximately 6.5 V or higher depending on the operating conditions and the type of transistor device used for low side transistor 14 (Q2). However, for this configuration, high side gate driver 30 requires some form of regulator. Conventionally, this is implemented with an internal bootstrap diode that is used to provide power to the high side transistor in the half-bridge configuration. Ideally, a Schottky diode is used because its small, it has a low forward voltage drop and no reverse recovery charge. However, it is very difficult to make a high voltage (100V) Schottky diode in an integrated circuit process and hence, PN junction diodes that have reverse recover charge are often used. Moreover, high voltage Schottky diodes can also have reverse recovery charges ($Q_{RR}$) that lead to losses.

To this end, when GaN FETs are used for transistors 12 and 14 (Q1 and Q2) for this type of half bridge topology, the reverse recovery charges $Q_{RR}$ of the Schottky diodes or PN junction diodes can affect performance and induce losses in the high side transistor. Normally these losses are negligible in comparison to other power loss mechanisms in the circuit. However, the reverse recovery charge losses are proportional to frequency, and at higher operating frequencies will increase to the point where it becomes a significant portion of the converter losses. Consequently, conventional methods of bootstrapping are not efficient at high switching frequencies of operation.

SUMMARY OF THE INVENTION

The present invention relates to a bootstrap supply for a half bridge topology, and, more particularly, a bootstrap supply using a gallium nitride (GaN) FET. Advantageously, a GaN FET is useful for high voltage applications because it has a zero reverse recovery charge $Q_{RR}$, and can be switched synchronously with the low side transistor of the half bridge circuit. The synchronous switch avoids a high boot-strap supply voltage if the lower FET "body diode" conducts. Moreover, the zero reverse recovery charge $Q_{RR}$ of the bootstrap device significantly improves the switching performance, particularly for ultra-low capacitance devices and reduces the losses induced in the high side device.

To this end, an electrical circuit arranged in a half bridge topology is provided. The electrical circuit comprises: a high side transistor; a low side transistor; a high side gate driver and level shifter electrically coupled to a gate of the high side transistor; a low side gate driver electrically coupled to a gate of the low side transistor; a capacitor electrically coupled in parallel with the high side gate driver and level shifter; a voltage source electrically coupled to an input of the high side gate driver and level shifter and an input of the low side gate driver; and, a bootstrap transistor electrically coupled between the voltage source and the capacitor.

In some embodiments, the bootstrap transistor is a GaN field-effect transistor. Depending on the embodiment, the bootstrap transistor may be a depletion mode transistor or an enhancement mode transistor. In some embodiments where the bootstrap transistor is a depletion mode transistor, a gate of the depletion mode transistor is electrically coupled to the output of the gate driver. In the depletion mode embodiment, the drain of the depletion mode transistor is electrically coupled to the input of the high side gate driver and level shifter.

If an enhancement mode transistor is used as the bootstrap device, it may be clamped or unclamped depending on the embodiment. If the enhancement mode transistor is clamped, it may be clamped with a Zener diode in parallel with the bootstrap capacitor. A resistor may be disposed in series between a drain of the enhancement mode transistor and the Zener diode. The resistor may be integrated into the enhancement mode transistor. Preferably, the Zener diode clamps the voltage across a bootstrap capacitor to a safe level for the upper side device.

The enhancement mode transistor may be clamped with two enhancement mode GaN field-effect transistors connected in series with a gate of each shorted to their respective sources.

In embodiments where an enhancement mode transistor is used, the voltage supplied to the enhancement mode transistor may be a higher voltage than the voltage supplied to the gate driver. In some of these embodiments, more than one voltage supply may be used.

In some embodiments, the low side gate driver may need to be regulated. In some embodiments, a regulator may be placed in electrical communication with the low side gate driver.

In some embodiments, a diode is electrically coupled between the source voltage and a gate of the transistor; and, a second capacitor is electrically coupled between the gate of the transistor and an output of the gate driver.

In another aspect of the present invention, a method of bootstrapping a half bridge circuit is provided. In preferred embodiments, a GaN field-effect transistor is synchronously switched with the low side transistor of the half bridge circuit, which is preferably a GaN field-effect transistor.

In preferred embodiments, the voltage across the source and drain of the GaN field-effect transistor is equal to the voltage across the source and drain of the low side device transistor.

In some embodiments, the voltage across the gate and source of the low side device transistor is zero (0) Volts, and the voltage across the gate and source of the GaN field-effect transistor is negative five (−5) Volts, when values of a drain current are worst case.

DETAILED DESCRIPTION OF THE PREFERRED EMBODIMENTS

In the following detailed description, reference is made to exemplary embodiments of the present invention. The exemplary embodiments are described with sufficient detail to enable those skilled in the art to practice them. It is to be understood that other embodiments may be employed and that various structural, logical, and electrical changes may be made.

Figure 1:
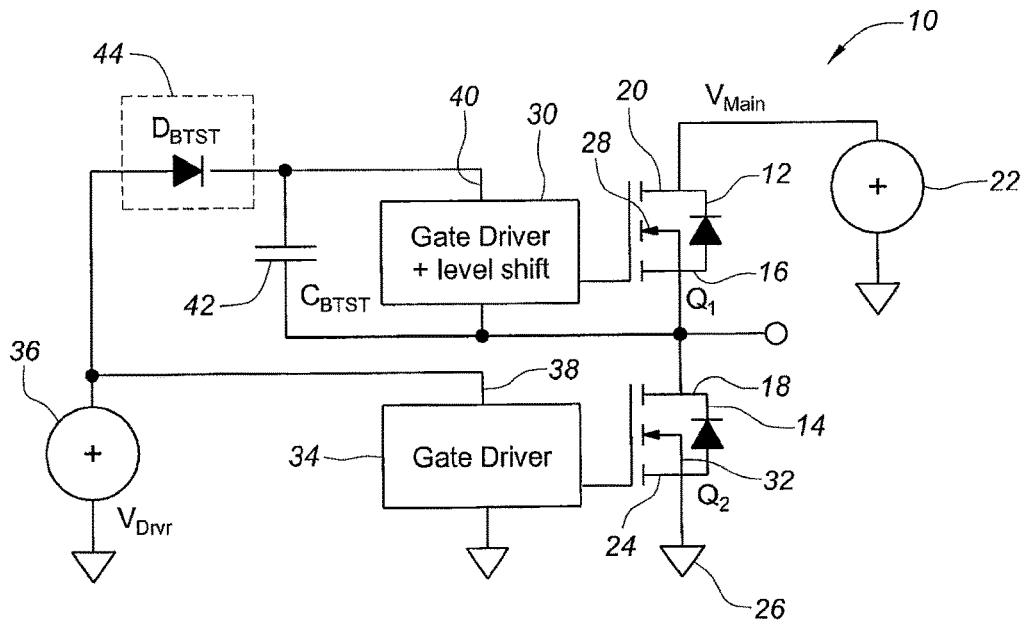
FIG. 1 illustrates a conventional bootstrap supply for a half bridge topology circuit.
Figure 2:
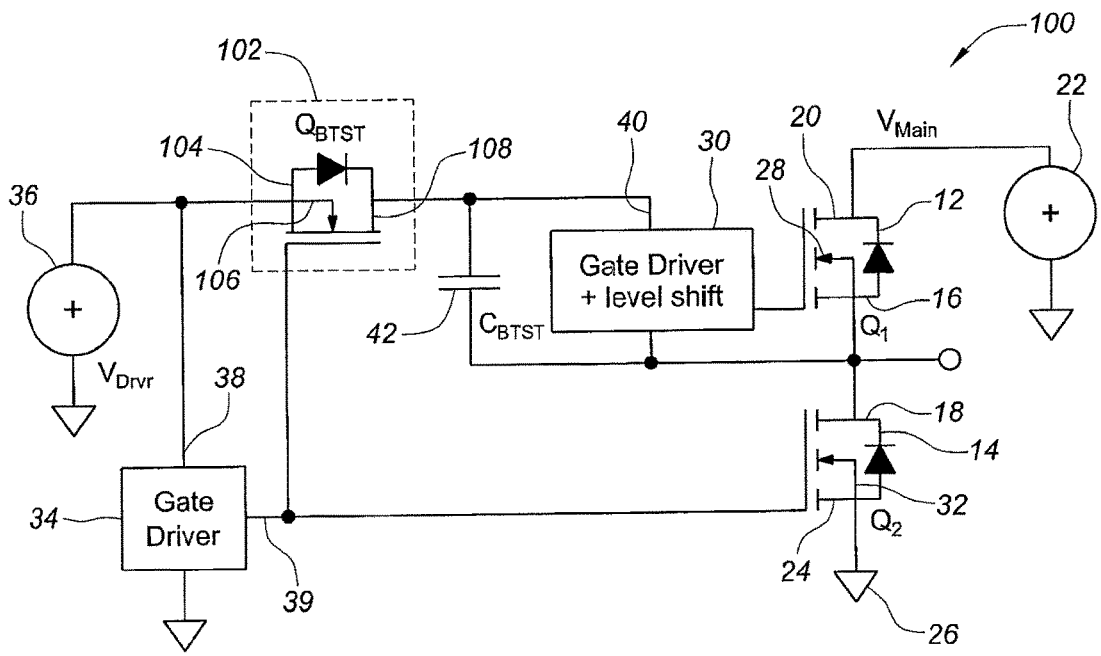
FIG. 2 illustrates a bootstrap supply for a half bridge topology according to a first embodiment of the present invention.

FIG. 2 illustrates a bootstrap supply for a half bridge topology according to a first embodiment 100 of the present invention. As shown, the design of FIG. 2 includes many of the same components as the conventional half bridge topology 10 discussed above. Namely, high side and low side transistors 12 and 14 (Q1 and Q2) are provided, with their respective gates coupled to a high side gate driver 34 and level shifter, and a low side gate driver 30, respectively. However, in contrast to the conventional design of FIG. 1, the exemplary design of FIG. 2 employs a depletion mode transistor (e.g., an n-channel depletion mode field-effect transistor (FET)) as the bootstrap device 102. Preferably, the bootstrap device 102 ($Q_{BTST}$) is a GaN FET.

As shown, the source 104 of the bootstrap device 102 ($Q_{BTST}$) is coupled to the voltage source 36 ($V_{Drvr}$). The gate 106 of the bootstrap device 102 ($Q_{BTST}$) is coupled to the output 39 of the low side gate driver 34. The drain 108 of the bootstrap device 102 ($Q_{BTST}$) is coupled to the input 40 of the high side gate driver and level shifter 30. Advantageously, the bootstrap device 102 ($Q_{BTST}$) of the exemplary embodiment is synchronized to the switching of low side transistor 14 (Q2), which overcomes the 7.5 V across the bootstrap capacitor 42 ($C_{BTST}$) discussed above for the conventional design.

The voltage across the source and drain $V_{SD}$ for the bootstrap device 102 ($Q_{BTST}$) should be the same as the voltage across the source and drain for transistor 14 (Q2). Moreover, the voltage across the gate and the source $V_{GS}$ for transistor 14 (Q2)=0 volts and the voltage across the gate and the source $V_{GS}$ for the bootstrap device 102 ($Q_{BTST}$) is −5 volts, where the values of the drain current (ID) are worst case. Even though the voltage between the drain and the source $V_{DS}$ should have the same rating for both the bootstrap device 102 ($Q_{BTST}$) and the main transistors 12 and/or 14 (FETs Q1 and/or Q2), the bootstrap device 102 ($Q_{BTST}$) can be significantly smaller (higher $R_{DS(on)}$). Moreover, the bootstrap device 102 ($Q_{BTST}$) can be integrated within an integrated half-bridge device pair.

To ensure that implementation of the synchronous FET bootstrap circuit 10 has minimal impact to the gate driver and power circuits and operates under any condition, the circuit 10 needs to be designed to be robust under severe conditions. In preferred embodiments, the following conditions may be accounted for: Low side FET reverse conduction; Hard switching following low side reverse conduction (a high loss $C_{OSS}$ transition); Partial zero voltage switching (PZVS); Self-commutation followed by upper FET reverse conduction; and, Zero voltage switching (ZVS), the least severe condition.

Figure 3:
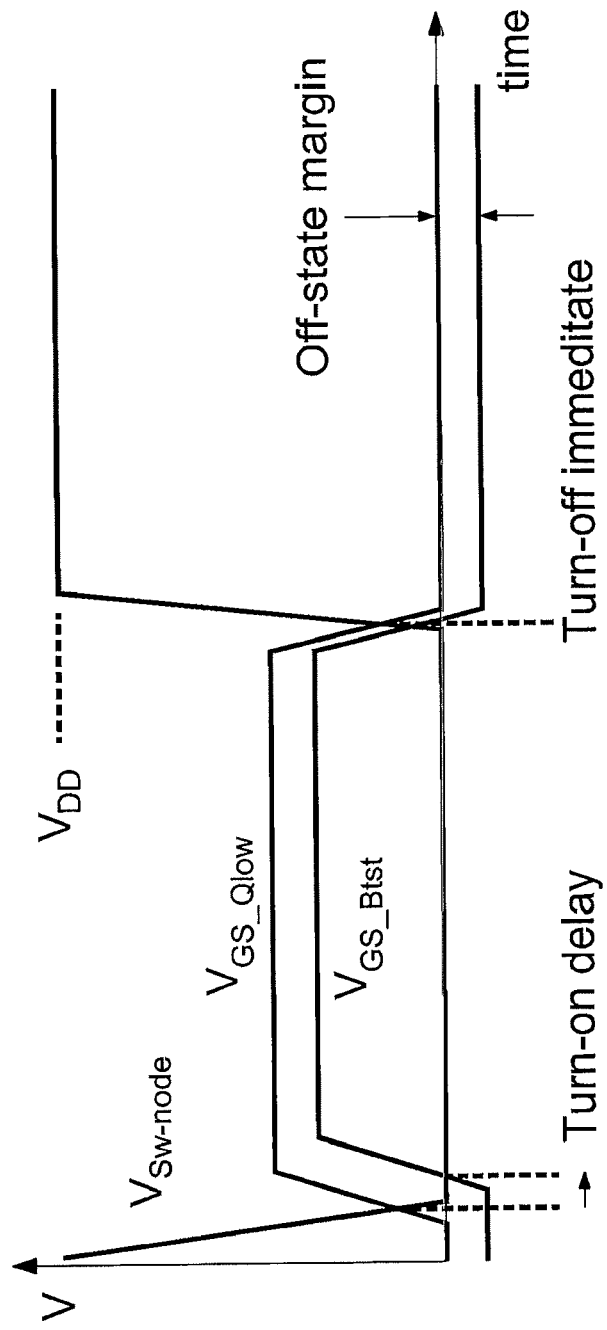
FIG. 3 illustrates a timing diagram of a preferred embodiment of a circuit using a eGaN transistor as a bootstrap device.

As mentioned above, embodiments using an FET for the bootstrap device 102 are preferably synchronized. FIG. 3 illustrates a timing diagram for a preferred embodiment of a bootstrap circuit including an FET bootstrap device 102. The correct timing helps handle or eliminate the effects of severe conditions listed above. In operation, it takes time for the switch-node voltage to transition from high to low following the rise of the low side transistor 14 gate voltage. If the small synchronous FET bootstrap device 102 is turned on prematurely, the drain voltage will still be high. Under this condition the switch-node will be connected to the 5 V with disastrous consequences. Therefore, the turn on of the synchronous FET bootstrap device 102 must be adequately delayed to prevent this from happening. This delay is illustrated in FIG. 3 as the difference in the rise of $V_{GS\_Qlow}$ and $V_{GS\_BTST}$. For similar reasons, the turn off of the synchronous FET bootstrap device 102 must occur at the same time as the low side transistor 14. This is also illustrated in FIG. 3.

Another important design parameter for designing an embodiment that is resistant to the severe conditions listed above is the off-state margin. Since both the low side transistor 14 and the synchronous FET bootstrap device 102 may be eGaN FET devices, both may have similar reverse conduction voltage drops when held off. Under these conditions it is possible for the synchronous FET bootstrap device 102 to reverse conduct main current either together with or instead of the low side transistor 14. This can lead to an over-voltage condition across the bootstrap capacitor 42 which can lead to failure of the high side transistor gate 28. To prevent this from occurring, in some embodiments, the off state voltage of the synchronous FET bootstrap device 102 is held at −1 V, thereby increasing the reverse conduction voltage to be significantly higher that the low side transistor 14 and thus, preventing it from conducting. One example of an appropriate off-state margin is illustrated in FIG. 3.

In addition to timing and off-state margin, preferred embodiments use a circuit layout that prevents the drain circuit of the bootstrap device 102 from ringing to higher voltages. The drain circuit of the synchronous FET bootstrap device 102, can ring to higher voltages that can charge the bootstrap capacitor 42 leading to failure of the high side transistor gate 28.

Figure 4:
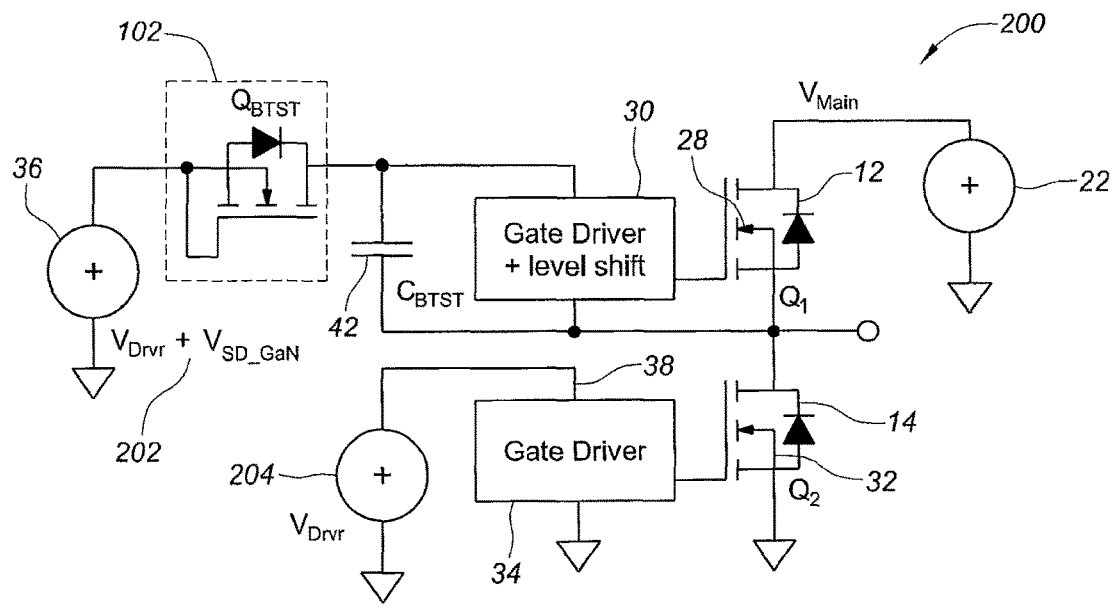
FIG. 4 illustrates a bootstrap supply for a half bridge topology according to a second embodiment 200 of the present invention.

FIG. 4 illustrates a bootstrap supply for a half bridge topology according to a second embodiment 200 of the present invention. As shown, the embodiment of FIG. 4 includes many of the same components as the conventional half bridge topology 10 discussed above. Namely, high side and low side transistors 12 and 14 (Q1 and Q2), with their respective gates 28 and 32 coupled to a gate driver and level shifter 30 and a gate driver 34, respectively. However, in contrast to the conventional design 10 of FIG. 1, the bootstrap device 102 ($Q_{BTST}$) is an unclamped enhancement mode device that is coupled between voltage source 36 ($V_{Drvr}$) and the bootstrap capacitor 42 ($C_{BTST}$). Moreover, an additional supply voltage 202 $V_{SD\_GaN}$ is also provided to the bootstrap device 102 ($Q_{BTST}$) to increase and overcome the voltage drop across the GaN FET body diode of the boot strap device 102 ($Q_{BTST}$). Voltage source 203 ($V_{Drvr}$) is applied to the low side gate driver 38 without the additional supply voltage 202 ($V_{SD\_GaN}$). The configuration yields approximately 7.5 V across the bootstrap capacitor 42 ($C_{BTST}$) if the body diode of transistor 14 ($Q_2$) conducts. However, the gate driver 34 requires some form of regulation for this configuration. Depending on the embodiment, the gate driver 34 may be internally or externally regulated. In other embodiments, the timing of the circuit 10 may regulate the low side gate driver 34. For example, the voltage source 36 driving the circuit 10 may be regulated and that regulation may in turn be passed on to the bootstrap capacitor 42 when the circuit is operating correctly. Similar to the embodiment of FIG. 2, the voltage across the source and drain $V_{SD}$ for the bootstrap device 102 ($Q_{BTST}$) should be the same or similar as the voltage across the source and drain for transistor 14 (Q2).

Figure 5:
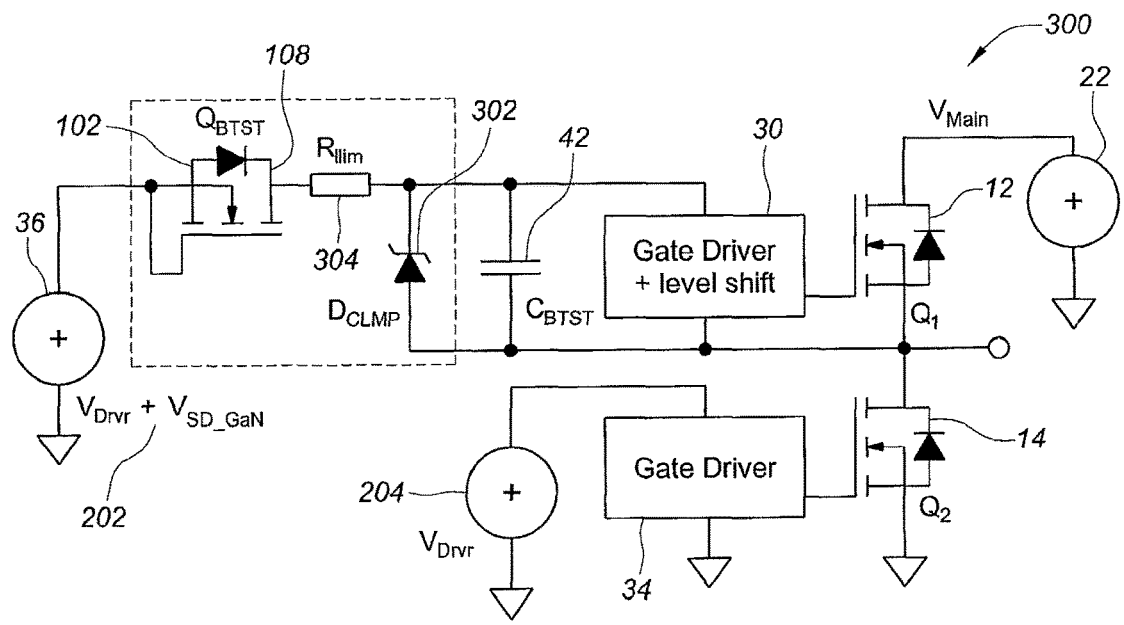
FIG. 5 illustrates a modification of the embodiment of FIG. 3.

The embodiment 300 in FIG. 5 illustrates a modification of the embodiment 200 of FIG. 4. The primary difference is that the bootstrap supply is clamped with a Zener clamp 302 (i.e., a Zener diode Dump) that is coupled in parallel to the bootstrap capacitor 42 ($C_{BTST}$). In the embodiment 300 shown in FIG. 5, a resistor 304 $R_{Ilim}$, is connected in series between the drain 108 of the bootstrap device 102 ($Q_{BTST}$) and the Zener clamp $D_{CLMP}$. The configuration of FIG. 5 uses the Zener clamp 302 to keep the voltage across the bootstrap capacitor 42 ($C_{BTST}$) within safe operating limits if the body diode of transistor 14 ($Q_2$) conducts. Moreover, the Zener clamp 302 ($D_{CLMP}$) clamps the voltage to a safe limit for the transistor 12 ($Q_1$), and the resistor 304 ($R_{Ilim}$) provides voltage buffer during clamping. Similar to the embodiment 100 of FIG. 2, the voltage across the source and drain $V_{SD}$ for the bootstrap device 102 ($Q_{BTST}$) should be the same or similar as the voltage across the source and drain for the transistor 14 (Q2). Similar to the configuration 200 of FIG. 4, an additional supply voltage 202 ($V_{SD\_GaN}$) is also provided to the bootstrap device 102 ($Q_{BTST}$) to overcome the voltage drop across the bootstrap device 102 body diode. As noted above, the bootstrap device 102 is preferably a GaN FET.

In one refinement of the exemplary embodiment of FIG. 5, the resistor 304 ($R_{Ilim}$) that provides the current limiting function can be integrated into the bootstrap device 102 ($Q_{BTST}$). In some embodiments, the resistor can be integrated by using RDS(on), i.e., with the internal resistance of the FET providing the appropriate resistance. In other embodiments, a resistive element may be added, such as a metal busing for example. In other embodiments, other resistive elements may be used. One advantage to integrating resistive element 304 is that it would eliminate an external component.

In yet other embodiments, the Zener clamp 302 may be achieved by using two enhancement GaN FETs connected in series with the gates of each shorted to their respective sources. This design would enable maximum integration for the circuit design.

Figure 6:
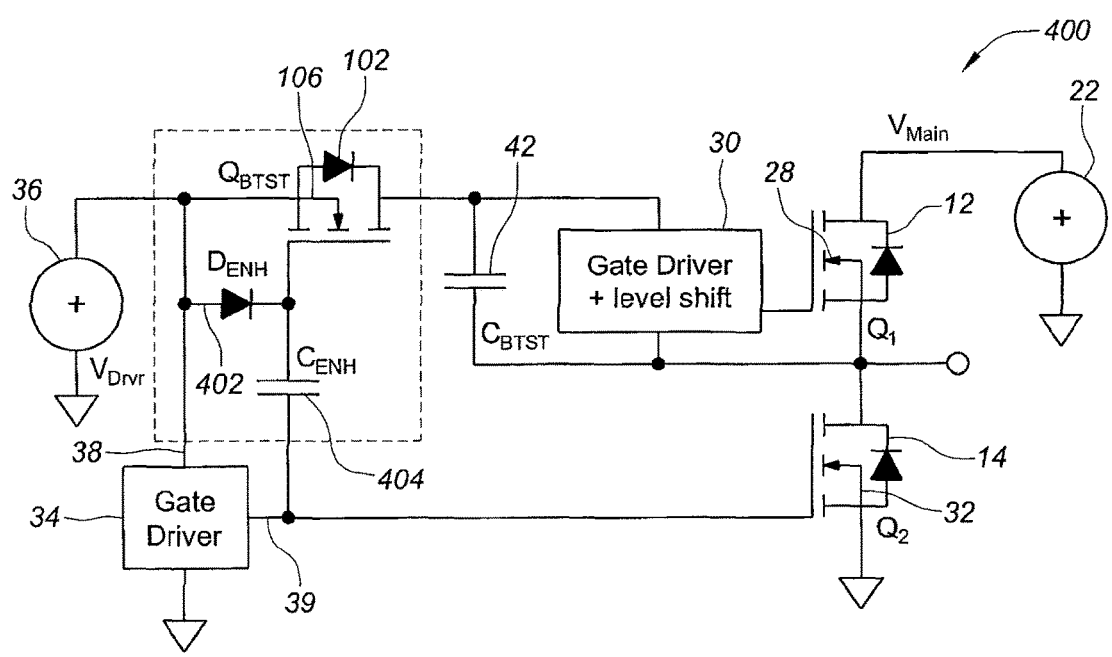
FIG. 6 illustrates a bootstrap supply for a half bridge topology according to an additional embodiment of the present invention.

FIG. 6 illustrates a bootstrap supply for a half bridge topology according to an additional embodiment 400 of the present disclosure. As shown, the design of FIG. 6 includes many of the same components as the half bridge topology discussed above with respect to embodiment 100 shown in FIG. 2. For example, embodiment 400 includes high side and low side transistors 12 and 14 (Q1 and Q2), with their respective gates 28 and 32 coupled to a gate driver and level shifter 30 and a gate driver 34, respectively. However, in contrast to the design of FIG. 2, the bootstrap supply can be considered a synchronous enhancement mode device implementation. As shown, the bootstrap device 102 $Q_{BTST}$ is coupled between the driving voltage source 36 ($V_{Drvr}$) and the high side gate driver and level shifter 30. In addition, an enhancement diode 402 ($D_{ENH}$) is coupled between the driving voltage source 36 ($V_{Drvr}$) and the gate 106 of the bootstrap device 102 ($Q_{BTST}$). Furthermore, an enhancement capacitor 404 ($C_{ENH}$) is coupled between the gate 106 of the bootstrap device 102 ($Q_{BTST}$) and an output 38 of the low gate driver 34.

In some embodiments, the enhancement diode 402 ($D_{ENH}$) may be integrated into the bootstrap device 102 to reduce the number of external components. In yet other embodiments, an enhancement mode resistor, in parallel with the enhancement diode 402, may also be integrated into the bootstrap device 102.

Advantageously, the bootstrap device 102 ($Q_{BTST}$) of the embodiment of FIG. 5 is synchronized to the switching of transistor 14 (Q2), which overcomes the 7.5 V across bootstrap capacitor 42 ($C_{BTST}$) discussed above for the conventional design. Synchronization prevents the "body diode" of the low side transistor 14 from over charging the high side transistor gate 28. In the exemplary embodiment, the voltage across the source and drain $V_{SD}$ for the bootstrap device 102 ($Q_{BTST}$) should be the same as the voltage across the source and drain for the transistor 14 (Q2). Moreover, the voltage between the gate and the source ($V_{GS}$) for transistor 14 (Q2)=0 volts and the voltage between the gate and the source ($V_{GS}$) for the bootstrap device 102 ($Q_{BTST}$) is −5 volts where the values of the drain current ID are worst case. In the exemplary configuration, the voltage drop of enhancement diode 402 ($D_{ENH}$) lowers the voltage across the gate and source $V_{GS}$ of the bootstrap device 102 ($Q_{BTST}$) to below 0 V and, therefore, raises the voltage across the source to drain $V_{SD}$ increasing the difference between transistor 14 (Q2) and the bootstrap device 102 ($Q_{BTST}$) for additional margin. In addition, the enhancement capacitor 404 ($C_{ENH}$) is charged (for example, to 5 V) in the same manner as a traditional boot-strap supply, but the enhancement diode 402 ($D_{ENH}$) used can be a low voltage (e.g., <20 V) Schottky diode with zero or ultra-low reverse recovery charge $Q_{RR}$.

It should be appreciated that for each of the exemplary embodiments discussed above, additional timing can be added to the configurations to drive the boot-strap devices 102 ($Q_{BTST}$) to allow time for the main transistors 12 and 14 (Q1 and Q2) to complete their switching transitions, most notably the turn-on event of transistor 14 (Q2). Moreover, when the boot strap device 102 ($Q_{BTST}$) is on, it can conduct current in both directions in the same manner as a resistor. In addition, the voltage across the enhancement capacitor ($C_{ENH}$) can be controlled (reduced) to add additional body diode voltage margin of the bootstrap device 102 ($Q_{BTST}$) during the off state that further reduces the likelihood that the reverse voltage of the conduction of the body diode of transistor (Q2) can increase the bootstrap supply voltage above safe operating limits.

Some embodiments may further include timing circuitry to allow the low side transistor 14 time to turn fully on before the bootstrap transistor 102 turns on. The timing circuit may also immediately, or as quickly as possible, turn off the bootstrap transistor 102 when the voltage at the gate of the low side transistor 14 is reduced to zero (0).

Through experimentation, it has been shown that the embodiments described above can be sensitive to drain inductance of the bootstrap transistor 102, which can ring if not kept in check. Besides generally keeping inductance design with the design/choice of transistor, a small series resistor may be added in series after the drain of the bootstrap transistor 102. This resistor may be integrated to the bootstrap transistor 102. In some embodiments the resistor may be integrated by designing the bootstrap transistor 102 with a high RDS(on) approximately 3Ω. In yet other embodiments, the resistor may just be an integrated damping resistor (not RDS(on) but discrete).

It should be appreciated that the transistors used for the bootstrap device of each exemplary embodiment shown in FIGS. 2, 4-6 are preferably can be GaN FETs. Finally, it should be appreciated that the configurations for boot-strap device discussed above are provided to drive gallium nitride "GaN" FETs, but the exemplary embodiments are in no way limited and can also be used to drive regular MOSFETs (e.g., for a half bridge topology). Moreover, the techniques discussed above will not work using a MOSFET as the bootstrap device 102 if the half bridge transistor are also MOSFETs. There are 2 main reasons for this: 1) To work properly the bootstrap transistor MUST make use of the reverse conduction voltage characteristic of GaN where the voltage drop can be programmed by the magnitude of the negative gate voltage. This buys the immunity from the internal diode from conducting when it should not. MOSFETs can not perform in this manner and thus, could become part of the main power circuit with disastrous consequences. 2) MOSFETs have Qrr whereas eGaN FETs do not. Should the MOSFET diode conduct (for whatever reason), the benefits of the techniques taught here, will be completely lost.

The above description and drawings are only to be considered illustrative of specific embodiments, which achieve the features and advantages described herein. Modifications and substitutions to specific process conditions can be made. Accordingly, the embodiments of the invention are not considered as being limited by the foregoing description and drawings.

What is claimed is:

1. An electrical circuit arranged in a half bridge topology, comprising:
   a high side transistor;
   a low side transistor;
   a first gate driver and a level shifter electrically coupled to a gate of the high side transistor;
   a second gate driver electrically coupled to a gate of the low side transistor;
   a capacitor electrically coupled in parallel with the first gate driver and the level shifter;
   a voltage source electrically coupled to an input of the first gate driver and the level shifter and to an input of the second gate driver; and,
   a bootstrap device electrically coupled between the voltage source and the capacitor, wherein the bootstrap device is a GaN field-effect transistor synchronously switched with the low-side transistor.

2. The electrical circuit of claim 1, wherein the bootstrap device is a depletion mode transistor, and a gate of the depletion mode transistor is electrically coupled to the output of the gate driver.

3. The electrical circuit of claim 2, wherein a drain of the depletion mode transistor is electrically coupled to the input of the gate driver and level shifter.

4. The electrical circuit of claim 1, wherein the bootstrap device is an enhancement mode transistor.

5. The electrical circuit of claim 4, wherein the enhancement mode transistor is unclamped.

6. The electrical circuit of claim 4, wherein the enhancement mode transistor is clamped with a Zener diode in parallel with the capacitor.

7. The electrical circuit of claim 4, wherein a higher voltage is supplied to the enhancement mode transistor than is supplied to the gate driver.

8. The electrical circuit of claim 4, further comprising a regulator in electrical communication with the gate driver.

9. The electrical circuit of claim 6, further comprising a resistor in series between a drain of the enhancement mode transistor and the Zener diode.

10. The electrical circuit of claim 6, wherein the resistor is integrated into the enhancement mode transistor.

11. The electrical circuit of claim 4 wherein the enhancement mode transistor is clamped with two enhancement mode GaN field-effect transistors connected in series with a gate of each shorted to their respective sources.

12. The electrical circuit of claim 1, further comprising: a diode electrically coupled between the source voltage and a gate of the bootstrap transistor; and, a second capacitor electrically coupled between the gate of the bootstrap transistor and an output of the gate driver.

13. The electrical circuit of claim 1, wherein the bootstrap device is integrated with the high side and low side transistors.

* * * * *